US009911656B1

(12) United States Patent
Cheng et al.

(10) Patent No.: US 9,911,656 B1
(45) Date of Patent: Mar. 6, 2018

(54) WIMPY DEVICE BY SELECTIVE LASER ANNEALING

(71) Applicant: INTERNATIONAL BUSINESS MACHINES CORPORATION, Armonk, NY (US)

(72) Inventors: Kangguo Cheng, Schenectady, NY (US); Nicolas J. Loubet, Guilderland, NY (US); Xin Miao, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/241,858

(22) Filed: Aug. 19, 2016

(51) Int. Cl.
| | | |
|---|---|---|
| *H01L 21/8234* | (2006.01) | |
| *H01L 29/78* | (2006.01) | |
| *H01L 29/08* | (2006.01) | |
| *H01L 29/24* | (2006.01) | |
| *H01L 29/267* | (2006.01) | |
| *H01L 29/66* | (2006.01) | |
| *H01L 21/268* | (2006.01) | |
| *H01L 21/324* | (2006.01) | |
| *H01L 27/088* | (2006.01) | |

(52) U.S. Cl.
CPC .... *H01L 21/823418* (2013.01); *H01L 21/268* (2013.01); *H01L 21/324* (2013.01); *H01L 21/823431* (2013.01); *H01L 27/0886* (2013.01); *H01L 29/0847* (2013.01); *H01L 29/24* (2013.01); *H01L 29/267* (2013.01); *H01L 29/66545* (2013.01); *H01L 29/7848* (2013.01)

(58) Field of Classification Search
CPC ............ H01L 29/7869; H01L 27/1225; H01L 29/78696; H01L 21/324; H01L 21/477; H01L 21/02532; H01L 21/823807; H01L 27/11582; H01L 29/1033; H01L 29/66537; H01L 29/78648; H01L 27/1222; H01L 29/66545; H01L 21/268; H01L 21/02255; H01L 29/66795; H01L 29/785; H01L 21/823814; H01L 21/823885

See application file for complete search history.

(56) References Cited

U.S. PATENT DOCUMENTS 8,099,686 B2   1/2012   Schultz
8,324,668 B2   12/2012   Huang et al.
(Continued)

FOREIGN PATENT DOCUMENTS

TW          201537751 A      10/2015

OTHER PUBLICATIONS

Disclosed Anonymously, "Selective Strain Relaxation of Fins in FinFET Structures by Implantation and Recrystallization" ip.com No. IPCOM000242695D (Aug. 4, 2015) pp. 1-4.

*Primary Examiner* — Sonya D McCall Shepard
(74) *Attorney, Agent, or Firm* — Tutunjian & Bitetto, P.C.; Vazken Alexanian (57) ABSTRACT

A method for co-integrating wimpy and nominal devices includes growing source/drain regions on semiconductor material adjacent to a gate structure to form device structures with a non-electrically active material. Selected device structures are masked with a block mask. Unmasked device structures are selectively annealed to increase electrical activity of the non-electrically active material to adjust a threshold voltage between the selected device structures and the unmasked device structures.

16 Claims, 6 Drawing Sheets

(56) References Cited

U.S. PATENT DOCUMENTS

| | | |
|---|---|---|
| 8,476,716 B2 | 7/2013 | Anderson et al. |
| 9,257,505 B2 | 2/2016 | Lai et al. |
| 9,337,193 B2 | 5/2016 | Liao et al. |
| 9,337,306 B2 | 5/2016 | Peng et al. |
| 2002/0192914 A1* | 12/2002 | Kizilyalli ............ H01L 21/2257 438/300 |
| 2010/0181629 A1* | 7/2010 | Hoefler ............. H01L 27/11293 257/402 |
| 2011/0147765 A1 | 6/2011 | Huang et al. |
| 2015/0235897 A1 | 8/2015 | Fu et al. |
| 2015/0325646 A1 | 11/2015 | Lai et al. |

\* cited by examiner

WIMPY DEVICE BY SELECTIVE LASER ANNEALING

BACKGROUND

Technical Field

The present invention generally relates to semiconductor processing, and more particularly to methods and devices having a combination of wimpy and nominal devices integrated together by employing a selective anneal, e.g., laser annealing.

Description of the Related Art

Devices in non-critical circuit paths are preferred to have larger threshold voltages (Vt) than nominal devices. This assists in maintaining low leakage rates while not compromising circuit performance. These devices with larger Vt are called 'wimpy' devices. Conventionally, wimpy devices are made with larger gate lengths (Lg) and have higher channel doping than the nominal devices. These features employ special device and mask designs and require additional steps of lithography and implantation.

As devices scale down, making wimpy devices with larger Lg and a same contacted gate (poly) pitch (CPP) as for the nominal devices is impractical because there is very little room for contacts, among other things.

SUMMARY

In accordance with embodiments of the present invention, a method for co-integrating wimpy and nominal devices includes growing source/drain regions on semiconductor material adjacent to a gate structure to form device structures with a non-electrically active material. Selected device structures are masked with a block mask. Unmasked device structures are selectively annealed to increase electrical activity of the non-electrically active material to adjust a threshold voltage between the selected device structures and the unmasked device structures.

Another method for co-integrating wimpy and nominal devices includes forming fins on or in a substrate; forming a gate structure over the fins; growing source/drain regions on the fins adjacent to the gate structure to form device structures with $Si_3P_4$; masking selected device structures with a block mask; and selectively annealing unmasked device structures to increase electrical activity of the $Si_3P_4$ by decomposition to adjust a threshold voltage between the selected device structures and the unmasked device structures.

A device having co-integrated wimpy and nominal transistors includes first source/drain regions formed on semiconductor material adjacent to a first gate structure to form nominal device structures with a $Si_3P_4$ material, and second source/drain regions formed on the semiconductor material adjacent to a second gate structure to form wimpy device structures with a decomposed $Si_3P_4$ material. The wimpy device structures have a higher threshold voltage than the nominal device structures.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with aspects of the present invention, devices and methods are provided for forming wimpy devices with a same gate length (Lg), contacted gate (poly) pitch (CPP), and a same channel doping as nominal devices to save design and processing costs. In accordance with useful embodiments, wimpy and nominal devices are formed concurrently and include similar structure and materials.

In one particularly useful embodiment, source/drain epitaxial growth is performed in a phosphine environment. $Si_3P_4$ is formed when an overabundance of phosphine flows into a process gas during a fast growing low temperature epitaxial silicon process. The $Si_3P_4$ compound gets incorporated into the silicon lattice and creates a tensile strain (as compared with the underlying silicon substrate lattice, e.g., on a planar substrate or a fin). The phosphorus is chemically bonded and not electrically active (e.g., an overall phosphorus concentration can be about $4 \times 10^{21}$ atoms, but only $2 \times 10^{20}$-$3 \times 10^{20}$ phosphorus atoms are electrically active. Electrical active phosphorus is not bound in the $Si_3P_4$.

$Si_3P_4$ is very thermally stable. However, in accordance with one embodiment, laser selective annealing (LSA) can be employed to heat the epitaxially grown material at or above 1200 degrees C., which relaxes the strain, but also increases the active phosphorus amount by decomposition of the $Si_3P_4$ compound. Resistance of relaxed $Si_3P_4$ is nearly the same as strained $Si_3P_4$. In this way, the threshold voltage of some devices can be altered in accordance with the LSA while maintaining a common processing of the semiconductor devices (e.g., wimpy and nominal devices).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with embodiments of the present invention. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
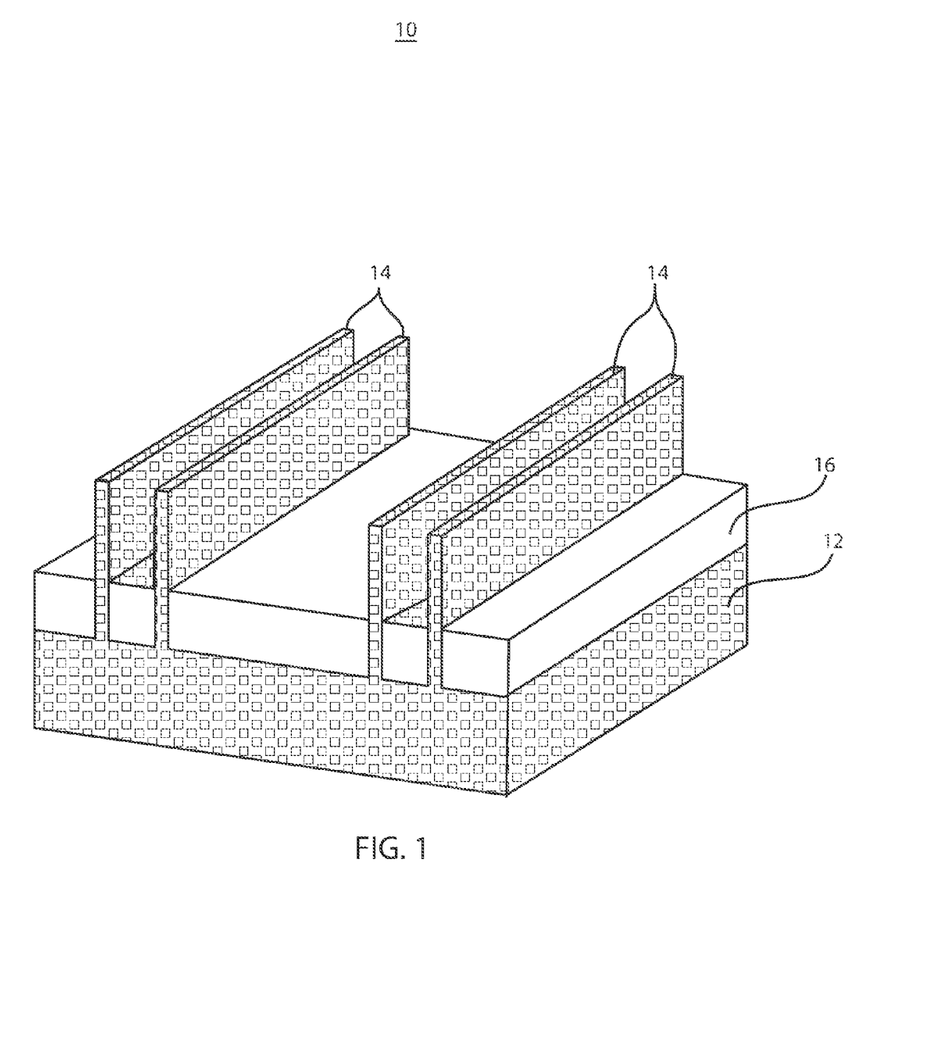
FIG. 1 is a perspective view showing fins formed on/in a substrate in accordance with aspects of the present invention.

Referring now to the drawings in which like numerals represent the same or similar elements and initially to FIG. 1, a partially fabricated semiconductor device 10 is shown having fins 14 formed from a substrate 12. The substrate 12 can include a bulk-semiconductor substrate. In one example, the bulk-semiconductor substrate 12 can be a silicon-based material. Illustrative examples of Si-based materials suitable for the bulk-semiconductor substrate 12 include, but are not limited to, Si, SiGe, SiGeC, SiC, etc. and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc sellenide, etc.

Although not depicted in FIG. 1, the semiconductor substrate 12 can also be a semiconductor on insulator (SOI) substrate.

Fins 14 can be etched into the substrate 12 by employing a lithographic patterning process, a spacer image transfer process (e.g., self-aligned quadruple patterning (SAQP) or a self-aligned double patterning (SADP)), etc. to form an etch mask and then etch the substrate 12 using, e.g., a reactive ion etch (RIE) process. The fins 14 are etched to a desired depth.

A dielectric layer 16 is deposited over the fins and recessed by a recess etch process to form a shallow trench isolation region 16. The dielectric layer 16 can include an oxide, although other suitable dielectric materials can be employed. The dielectric layer 16 can be formed by a blanket deposition process using, e.g., chemical vapor deposition (CVD) or other suitable processes. In an alternate embodiment, the blanket deposition of dielectric layer 16 is followed by a planarization process (e.g., chemical mechanical polishing (CMP)). Then, a fin cut process can be employed where the fin lengths are adjusted. This can include a lithographic patterning and etch. A reveal etch (selectively etched relative to the substrate/fin material) is performed to expose the fins 14 to provide the configuration depicted in FIG. 1.

Figure 2:
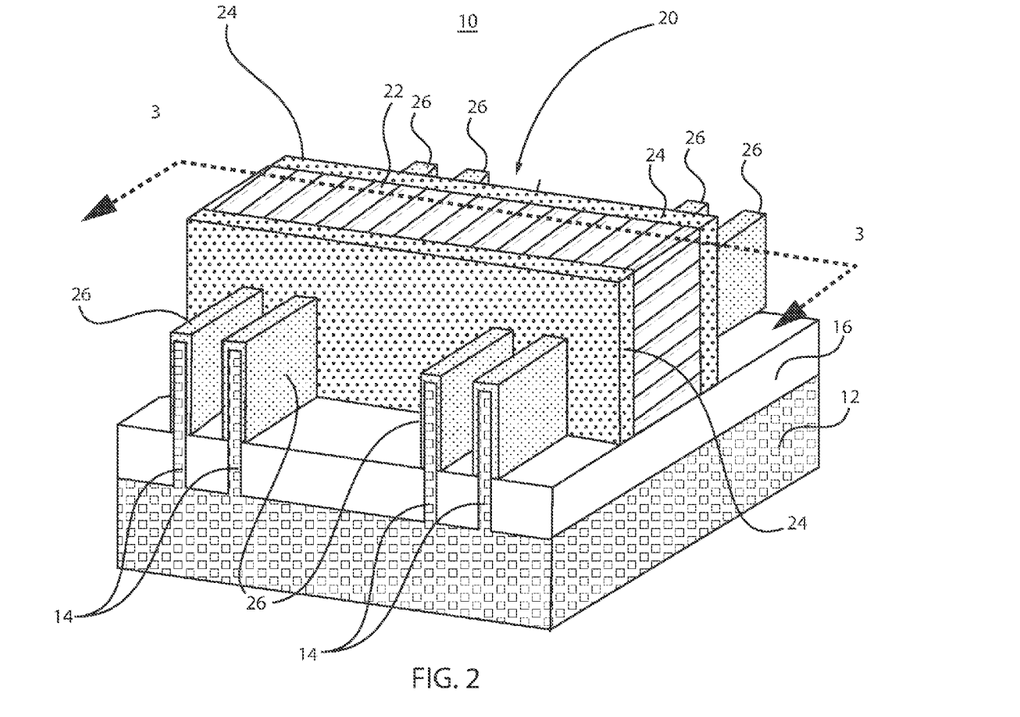
FIG. 2 is a perspective view showing a gate structure formed on the fins of FIG. 1 in accordance with aspects of the present invention.

Referring to FIG. 2, an extended gate (EG) oxide 26 is formed over the fins 14. The oxide 26 can be formed by an oxidation process or by atomic layer deposition (ALD). The oxidation process forms the oxide 26 over exposed portions of the fins 14. Then, a gate formation process is performed to provide a gate structure 20.

The gate formation process can include a gate first process or a replacement gate or gate last process. In a gate first process, gate materials are formed and patterned that will be employed as the actual gate. In a gate last process, a dummy gate is formed and then later removed and replaced by permanent gate materials.

A gate material 22 is deposited and patterned using lithography, SADP, etc. and etching (e.g., RIE). A hardmask (not shown) can be deposited on the gate materials 22 and patterned along with the gate materials 22. The hardmask can include a suitable dielectric material, such as, e.g., silicon nitride or silicon oxynitride.

The gate materials 22 can include polysilicon or amorphous silicon if a dummy gate is employed for a gate last/replacement gate structure. The gate material 22 is patterned over the fins 14, and a spacer 24 is formed on sidewalls of the gate material 22.

A conformal spacer layer is deposited over all surfaces of the device 10. The conformal layer can include a thin coating having a thickness of between about 2 nm to about 15 nm. The conformal layer can be deposited using a CVD process, an atomic layer deposition (ALD) process or any other suitable conformal deposition process. The conformal layer can include, e.g., a nitride, oxynitride or other materials that can be selectively etched relative to surrounding materials. A reactive ion etch process is performed to remove the conformal spacer layer from horizontal surfaces and form spacers 24.

Figure 3:
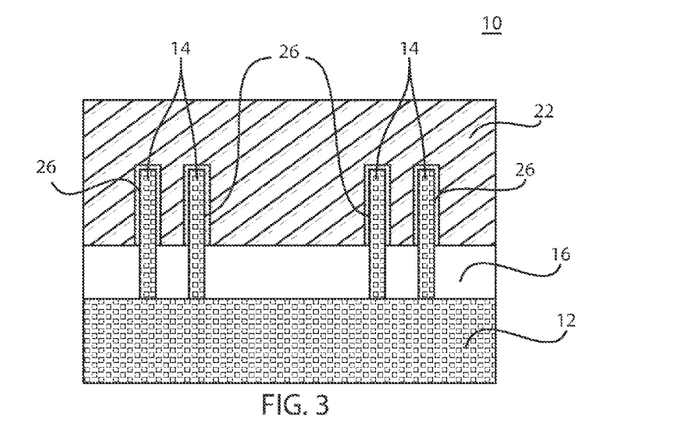
FIG. 3 is a cross-sectional view taken at section line 3-3 of FIG. 2 in accordance with aspects of the present invention.

Referring to FIG. 3, a cross-sectional view taken at section line 3-3 of FIG. 2 is shown. The fins 14 include the oxide 26 within the gate materials 22 (e.g., dummy gate). The oxide 26 can act as the gate dielectric for field effect transistors to be formed.

Referring to FIGS. 2 and 3, the oxide 26 is removed from the fins beyond the spacers 24 to expose the fins 14. The removal of the oxide 26 leaves the surfaces of the fins 14 ready for epitaxially cladding for the formation of source/drain (S/D) regions as depicted in FIG. 4.

Figure 4:
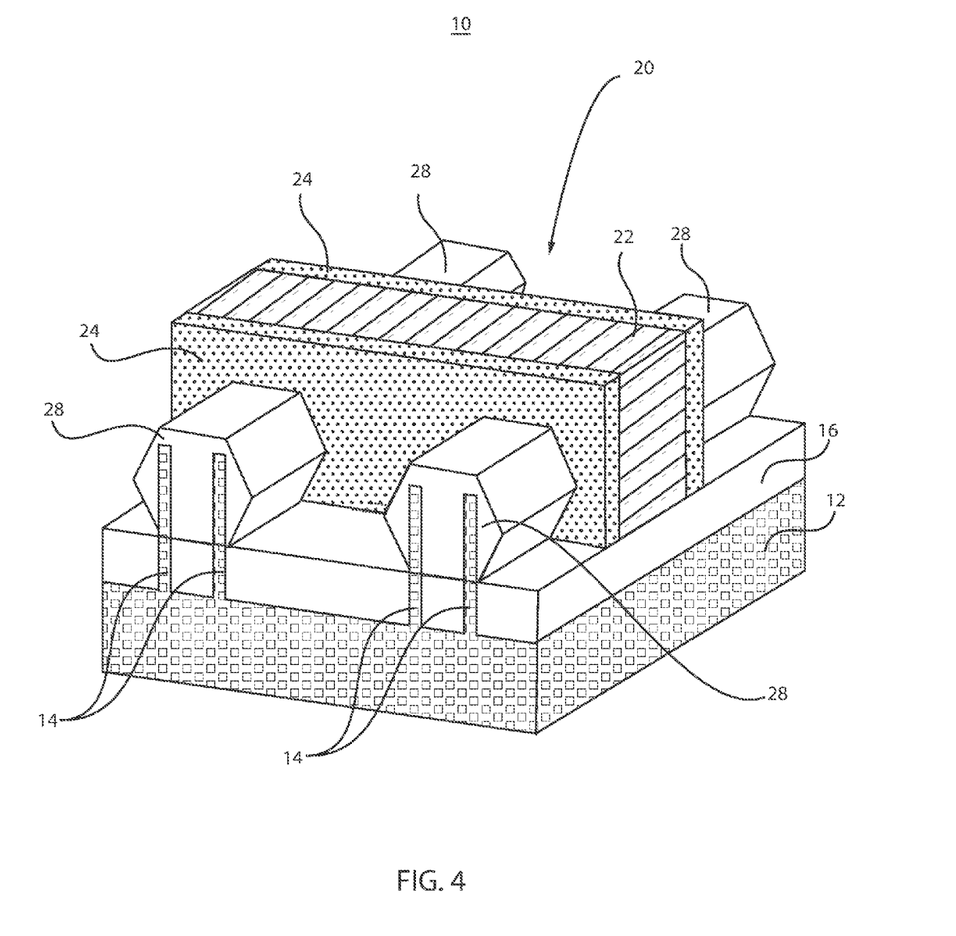
FIG. 4 is a perspective view showing source/drain regions formed over the fins of FIG. 2 in accordance with aspects of the present invention.

Referring to FIG. 4, portions of the fins 14 exposed by the removal of oxide 26 are prepared for the formation of S/D regions 28. S/D regions 28 are grown on the fins 14 by an epitaxial deposition process.

The epitaxial deposition process can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a $\{100\}$ orientated crystalline surface will take on a $\{100\}$ orientation. In some embodiments, epitaxial growth and/or deposition processes are selective to forming on semiconductor surface, and generally do not deposit material on exposed surfaces, such as silicon dioxide or silicon nitride surfaces.

In one embodiment, epitaxial silicon is grown in the presence of a phosphine flow to form thermally stable $Si_3P_4$. It should be understood that while $Si_3P_4$ is preferred, other materials can be formed that can be subjected to selective annealing to provide wimpy and nominal devices in accordance with aspects of the present invention.

A gas precursor selected from the group consisting of tertiary-butylphosphine (TBP), phosphine ($PH_3$), alkylphosphines, such as with the empirical formula $R_xPH_{(3-x)}$, where R=methyl, ethyl, propyl or butyl and x=1, 2 or 3 and/or combinations thereof can be employed. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The temperature for epitaxial deposition ranges from between, e.g., about 400 degrees C. to about 1000 degrees C.

The S/D regions 28 can be grown on a single fin 14 or on multiple fins 14. The $Si_3P_4$ provides strained S/D regions 28. In one embodiment, the stress of $Si_3P_4$ can be close to about 1.6 GPa with process optimization, which provides a corresponding strain. Strained S/D regions can transfer about one half the strain to a channel region (e.g., the fin region below the gate structure 20). The $Si_3P_4$ provides tensile strain that can lead to lower threshold voltage (Vt) for silicon n-type field effect transistors (nFETs).

To this point, the processing of the finFETs has been the same. In this way, wimpy devices and nominal devices are indistinguishable. In accordance with a device design, transistors will be designated for selective annealing to convert their threshold voltage.

Figure 5:
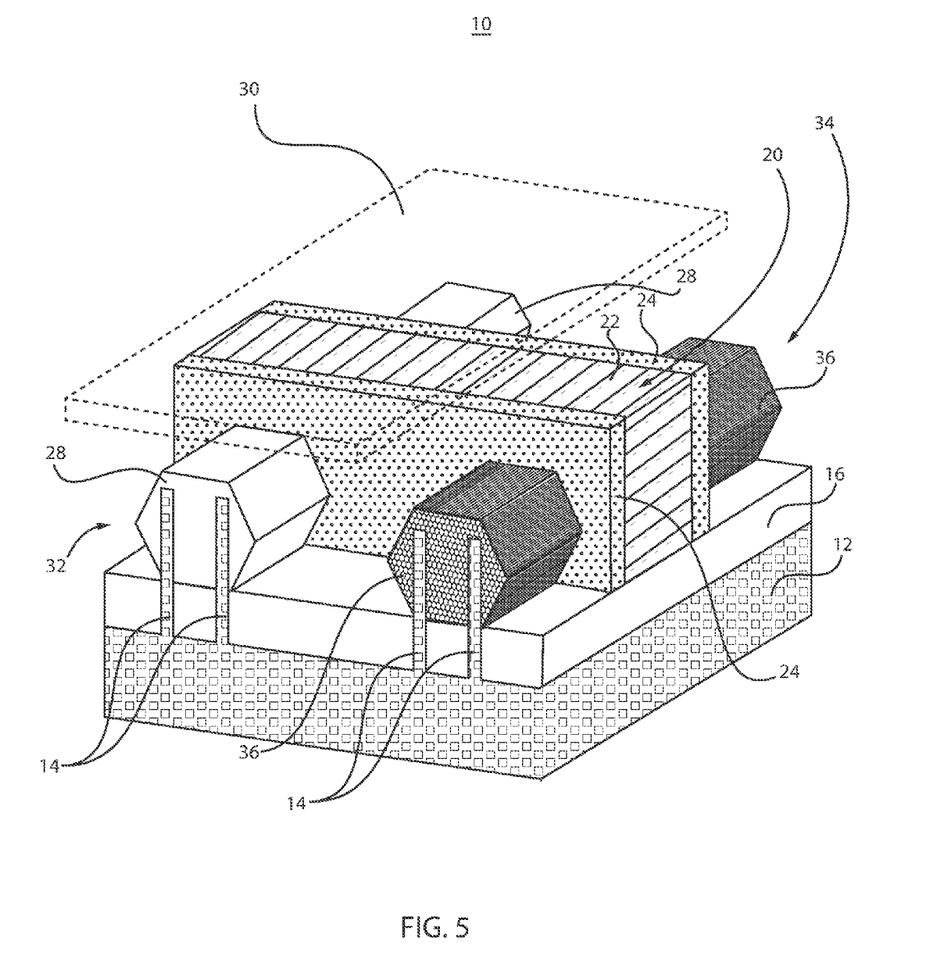
FIG. 5 is a perspective view showing a block mask formed over a portion of the source/drain regions of FIG. 4 and unmasked regions exposed to a selective anneal process (e.g., laser anneal) in accordance with aspects of the present invention.

Referring to FIG. 5, a block mask 30 is deposited over the device 10. The block mask 30 is patterned by lithography (e.g., photo lithography or electron beam lithography). In one embodiment, the block mask 30 includes a material that is reflective of laser light at a wavelength(s) of the laser light, e.g., metals such as e.g., Ag, Al, Cu, alloys of these or other materials containing metals can be employed. In this way, the block mask 30 protects a covered device 32 from laser light during a selective anneal process of an exposed device 34.

In accordance with one embodiment, laser selective annealing (LSA) can be employed to heat the epitaxially grown regions of exposed device 34 at or above about 1200 degrees C. The anneal can last for a few milliseconds (e.g., 2-6 milliseconds). The anneal relaxes the strain in the device 34, but also increases the active phosphorus amount by decomposition of the $Si_3P_4$ compound. The resistance of relaxed $Si_3P_4$ 36 of device 34 is nearly the same as strained $S_{i3}P_4$ in device 32. In this way, a threshold voltage of the devices 34 is altered while maintaining a common processing of the semiconductor devices.

In one embodiment, the threshold voltage (Vt) of the exposed devices 34 is larger than the covered devices 32. In one embodiment, the devices 32 and 34 have a same gate length (Lg), same contact pitch and/or gate pitch (CPP), and a same channel doping. This permits fewer changes to the process flow and results in a simpler design and reduced processing costs. Wimpy and nominal devices are formed together and include similar structures and materials. The block mask 30 is removed from over the covered device 32.

Figure 6:
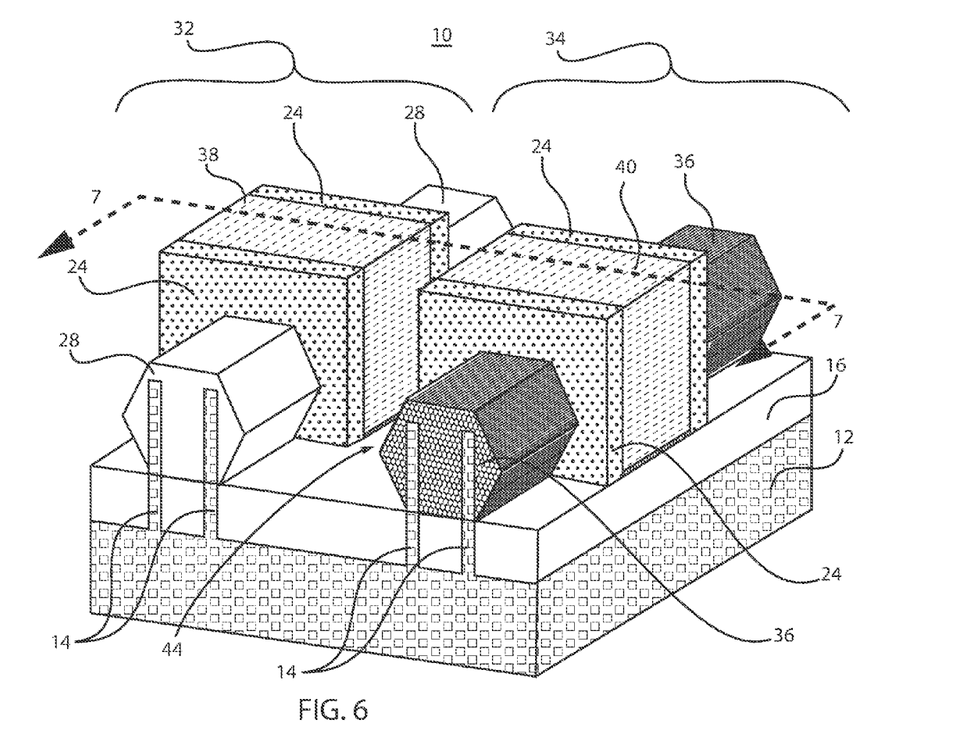
FIG. 6 is a perspective view showing nominal devices and wimpy devices co-integrated on a same device in accordance with aspects of the present invention.

Referring to FIG. 6, after the block mask 30 is removed, a gate cut process is performed to define gate dimensions and to separate gate structures between wimpy devices 34 and nominal devices 32. The gate cut includes a lithographic pattern and etch process to form a space 44 between portions of the gate structure.

If a dummy gate is employed, a replacement metal gate (RMG) process can be performed to replace the dummy gate with a replacement gate. This can include a dielectric fill, which is applied to the device 10. The dielectric fills in between gate structures and covers S/D regions 28, 36. The dielectric fill can include an oxide, such as a silicon oxide or can include polysilicon. Other materials can also be employed.

A planarization process, e.g., chemical mechanical polishing (CMP) is performed. The planarization process removes dielectric fill from a top surface and to expose the dummy gate (gate material 22). An etch process, such as, e.g., RIE is employed to selectively etch away the gate material 22 down to the STI 16 and remove oxide 26 from the fins 14.

Figure 7:
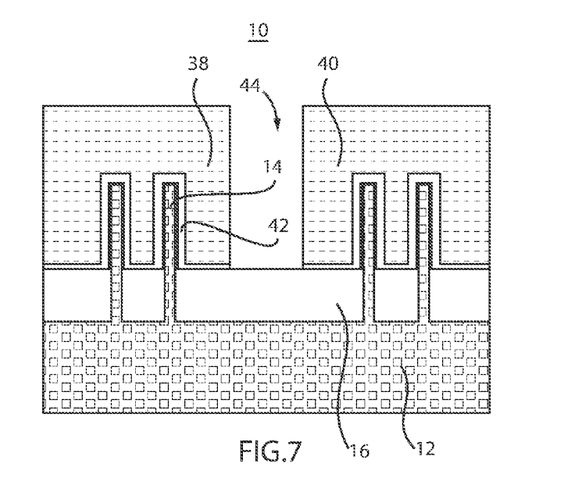
FIG. 7 is a cross-sectional view taken at section line 7-7 of FIG. 6 in accordance with aspects of the present invention.

A dielectric material 42 or the like is deposited over the fins 14 in between the spacers 24 to form a gate dielectric (42) as depicted in FIG. 7. FIG. 7 is a cross-sectional view of the gate conductors 38, 40 taken at section line 7-7 of FIG. 6.

The gate dielectric 42 can be an oxide, nitride and oxynitride material. In one embodiment, the gate dielectric 42 can be composed of a high-k dielectric layer, i.e., a dielectric having a dielectric constant that is greater than 4.0, as measured at room temperature. Such higher dielectric constant dielectric materials can include, but are not limited to, hafnium oxides, hafnium silicates, titanium oxides, barium-strontium-titantates (BSTs) and lead-zirconate-titanates (PZTs). In one embodiment, the gate dielectric 42 has a thickness ranging from 5 angstroms to 200 angstroms.

A conductive material (replacement metal) is deposited and planarized to form gate conductors 38, 40. The gate conductors 38, 40 can include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials.

Processing continues with the formation or processing of an interlevel dielectric layer (ILD) (not shown to depict the device structures). The ILD is patterned to form contact openings to the gate conductors 38, 40 and the S/D regions 28, 36.

In accordance with aspects of the present invention, nominal devices 32 are formed with strained $Si_3P_4$ S/D regions 28 to create devices with lower Vt, and wimpy devices 34 are formed with relaxed $Si_3P_4$ S/D regions 36 to create devices with higher Vt.

Figure 8:
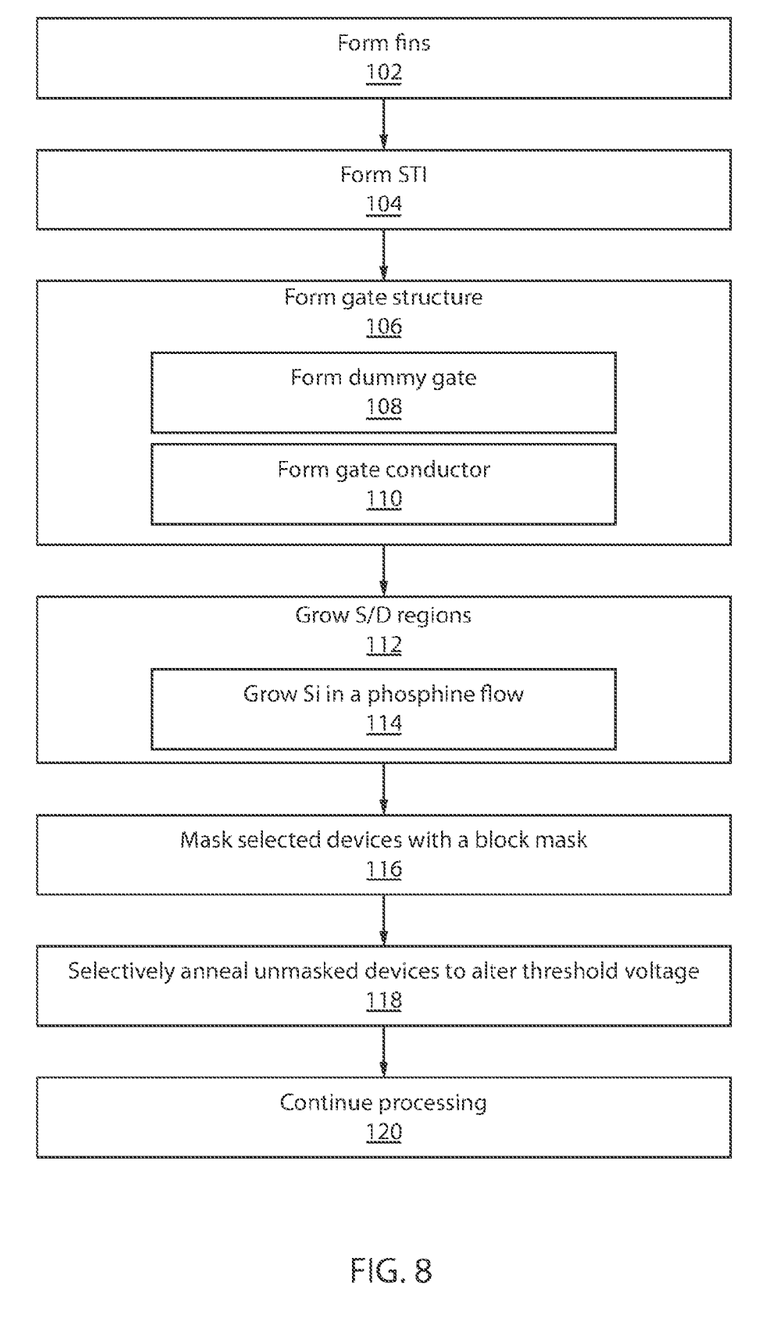
FIG. 8 is a block/flow diagram showing methods for co-integrating wimpy and nominal devices in accordance with aspects of the present invention.

Referring to FIG. 8, methods for co-integrating wimpy and nominal devices are illustratively shown in accordance with aspects of the present invention. In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are optionally formed on or in a substrate. In block 104, a shallow trench isolation (STI) region can be formed at the base of the fins. In block 106, a gate structure is formed (e.g., over the fins or on a planar region). In block 108, in one embodiment, the gate structure is formed using a dummy gate; and the dummy gate will be replaced later with a gate conductor after the source/drain regions are formed. In block 110, in another embodiment, the gate structure includes a gate conductor before the source/drain regions are formed.

In block 112, source/drain regions are grown on semiconductor material adjacent to the gate structure to form device structures with a non-electrically active material (e.g., $Si_3P_4$). The semiconductor material can be planar or include fins. In block 114, in one embodiment, source/drain regions are grown by epitaxially growing silicon in an abundance of phosphine.

In block 116, selected device structures are masked with a block mask. If lasers are employed for selective annealing in a next step, the block mask includes a reflective block mask to reflect laser light.

In block 118, unmasked device structures are selectively annealed to increase electrical activity of the non-electrically active material to adjust a threshold voltage between the selected device structures and the unmasked device structures. In one embodiment, selectively annealing the unmasked device structures includes exposing the unmasked device structures to laser light. The selective anneal includes annealing to 1200 degrees C. or greater, e.g., for a non-electrically active material that includes, e.g., $Si_3P_4$. The selected device structures (e.g., nominal devices) and the unmasked device structures (e.g., wimpy devices) are formed by a same process (except for stress relieving by selective anneal), and therefore have a same gate length, same channel doping, same contact pitch, etc. In block 120, processing continues to complete the device.

Having described preferred embodiments wimpy device by selective laser annealing (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for co-integrating wimpy and nominal devices, comprising:
    growing source/drain regions, including epitaxially growing silicon in an abundance of phospine, on semiconductor material adjacent to a gate structure to form device structures with a non-electrically active material;
    masking selected device structures with a block mask; and
    selectively annealing unmasked device structures to increase electrical activity of the non-electrically active material to adjust a threshold voltage between the selected device structures and the unmasked device structures.

2. The method as recited in claim 1, wherein the non-electrically active material includes $Si_3P_4$.

3. The method as recited in claim 1, further comprising forming a gate structure including:
    forming a dummy gate; and
    replacing the dummy gate with a gate conductor after the source/drain regions are formed.

4. The method as recited in claim 1, further comprising forming a gate structure including:
    forming a gate conductor before the source/drain regions are formed.

5. The method as recited in claim 1, wherein selectively annealing the unmasked device structures includes exposing the unmasked device structures to laser light.

6. The method as recited in claim 5, wherein masking the selected device structures with the block mask includes employing a reflective block mask to reflect the laser light.

7. The method as recited in claim 5, wherein selectively annealing includes annealing to 1200 degrees C. or greater.

8. The method as recited in claim 1, wherein the selected device structures and the unmasked device structures have a same gate length, same channel doping and same contact pitch.

9. A method for co-integrating wimpy and nominal devices, comprising:
    forming fins on or in a substrate;
    forming a gate structure over the fins;
    growing source/drain regions on the fins adjacent to the gate structure to form device structures with $Si_3P_4$;
    masking selected device structures with a block mask; and
    selectively annealing unmasked device structures to increase electrical activity of the $Si_3P_4$ by decomposition to adjust a threshold voltage between the selected device structures and the unmasked device structures.

10. The method as recited in claim 9, wherein forming the gate structure over the fins includes:
    forming a dummy gate; and
    replacing the dummy gate with a gate conductor after the source/drain regions are formed.

11. The method as recited in claim 9, wherein forming the gate structure over the fins includes:
    forming a gate conductor before the source/drain regions are formed.

12. The method as recited in claim 9, wherein selectively annealing the unmasked device structures includes exposing the unmasked device structures to laser light.

13. The method as recited in claim 12, wherein masking the selected device structures with the block mask includes employing a reflective block mask to reflect the laser light.

14. The method as recited in claim 12, wherein selectively annealing includes annealing to 1200 degrees C. or greater.

15. The method as recited in claim 9, wherein the selected device structures and the unmasked device structures have a same gate length, same channel doping and same contact pitch.

16. The method as recited in claim 9, wherein growing source/drain regions includes epitaxially growing silicon in an abundance of phosphine.

* * * * *